United States Patent
Yan et al.

(10) Patent No.: US 9,018,085 B2
(45) Date of Patent: Apr. 28, 2015

(54) METHOD OF FABRICATING MEMORY DEVICE WITH CHARGE STORAGE LAYER AT GAP LOCATED SIDE OF GATE DIELECTRIC UNDERNEATH THE GATE

(71) Applicant: MACRONIX International Co., Ltd., Hsinchu (TW)

(72) Inventors: Shih-Guei Yan, Hsinchu (TW); Wen-Jer Tsai, Hsinchu (TW); Cheng-Hsien Cheng, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/198,320

(22) Filed: Mar. 5, 2014

(65) Prior Publication Data

US 2014/0187032 A1     Jul. 3, 2014

Related U.S. Application Data (62) Division of application No. 13/304,380, filed on Nov. 24, 2011, now Pat. No. 8,698,222.

(51) Int. Cl.
| | |
|---|---|
| *H01L 29/66* | (2006.01) |
| *H01L 21/28* | (2006.01) |
| *H01L 29/423* | (2006.01) |
| *H01L 29/788* | (2006.01) |
| *H01L 29/792* | (2006.01) |
| *H01L 27/115* | (2006.01) |

(52) U.S. Cl.
CPC .... *H01L 29/66833* (2013.01); *H01L 21/28273* (2013.01); *H01L 21/28282* (2013.01); *H01L 29/42332* (2013.01); *H01L 29/42348* (2013.01); *H01L 29/7881* (2013.01); *H01L 29/792* (2013.01); *H01L 27/11521* (2013.01); *H01L 27/11568* (2013.01)

(58) Field of Classification Search
CPC ................ H01L 29/788; H01L 29/792; H01L 21/28273; H01L 21/28282; H01L 29/42332; H01L 29/7923; H01L 29/66825; H01L 29/66833; H01L 29/7887; H01L 29/42348
USPC ............ 257/288, 411, 410, 324, 405, E21.21, 257/E21.423, E29.255, E21.205, E21.18, 257/E21.679, E27.078, E29.309, E29.316, 257/E21.395; 438/261, 591, 593
See application file for complete search history.

(56) References Cited

U.S. PATENT DOCUMENTS

| | | | |
|---|---|---|---|
| 2002/0045319 A1* | 4/2002 | Ogura et al. ............... | 438/303 |
| 2004/0245564 A1* | 12/2004 | Ogura et al. ............... | 257/315 |
| 2005/0104117 A1* | 5/2005 | Mikolajick et al. ......... | 257/315 |
| 2006/0186480 A1 | 8/2006 | Seidl et al. | |

OTHER PUBLICATIONS

"Office Action of Taiwan Counterpart Application", issued on Aug. 8, 2014, p. 1-p. 4.

* cited by examiner

*Primary Examiner* — Selim Ahmed
(74) *Attorney, Agent, or Firm* — J.C. Patents (57) ABSTRACT

A method for fabricating a memory device of this invention includes at least the following steps. A tunnel dielectric layer is formed over a substrate. A gate is fowled over the tunnel dielectric layer. At least one charge storage layer is formed between the gate and the tunnel dielectric layer. Two doped regions are formed in the substrate beside the gate. A word line is formed on and electrically connected to the gate, wherein the word line having a thickness greater than a thickness of the gate.

15 Claims, 7 Drawing Sheets

METHOD OF FABRICATING MEMORY DEVICE WITH CHARGE STORAGE LAYER AT GAP LOCATED SIDE OF GATE DIELECTRIC UNDERNEATH THE GATE

CROSS-REFERENCE TO RELATED APPLICATION

This application is a divisional application of U.S. application Ser. No. 13/304,380, filed on Nov. 24, 2011. The entirety of the above-mentioned patent application is hereby incorporated by reference herein and made a part of this specification.

BACKGROUND OF THE INVENTION

1. Field of the Invention

This invention relates to an integrated circuit (IC) device and fabrication thereof, and more particularly relates to a memory device and a method for fabricating the same.

2. Description of Related Art

A memory is a semiconductor device for storing information or data. As the computer microprocessors become more and more powerful, programs and operations executed by the software are increased correspondingly. Consequentially, the demand for high storage capacity memories is getting more.

Among various types of memory products, a non-volatile memory allows multi-time data programming, reading and erasing operations, and the data stored therein can be retained even after the power to the memory is terminated. With these advantages, the non-volatile memory has become one of the most widely adopted memories for personal computers and electronic equipment.

Electrically programmable and erasable non-volatile memory technologies based on charge storage structures and known as Electrically Erasable Programmable Read-Only Memory (EEPROM) and flash memory are used in various modern applications. A flash memory is designed with an array of memory cells that can be independently programmed and read. Traditional flash memory cells store charges in a floating gate, but another type of flash memory uses a charge-trapping structure, such as a layer of non-conductive SiN material, instead of a floating gate including a conductive material. When a charge-trapping cell is programmed, charges are trapped and do not move through the non-conductive layer. The charges are retained by the charge trapping layer until the cell is erased, retaining the data state without continuously applied electrical power. Charge-trapping cells can be operated as two-sided cells. That is, because the charges do not move through the non-conductive charge trapping layer, the charges can be localized on different charge-trapping sites. On the other words, in the flash memory devices with the use of the charge-trapping structure, more than one bit of information is stored in each memory cell.

A single memory cell can be programmed to store two physically separated bits in the trapping structure, in the form of a concentration of charges near the source and another concentration of charges near the drain. Programming of the memory cell can be performed by Channel Hot Electron (CHE) injection, which generates hot electrons in the channel region. Some of the hot electrons gain enough energy to be trapped in the charge-trapping structure. By interchanging the biases applied to the source and drain terminals, charges are trapped either in a portion of the charge-trapping structure near the source region, near the drain region, or both.

Usually, one of four distinct combinations of bits 00, 01, 10 and 11 can be stored in a memory cell having a charge-trapping structure, wherein each combination has a corresponding threshold voltage (Vt). In a read operation, the current flowing through the memory cell varies depending upon the Vt of the cell. Typically, such current has one of four different values each corresponding to a different Vt. Accordingly, by sensing such current, the particular bit combination stored in the cell is determined.

The total available charge range or Vt range may be referred to as the memory operation window. In other words, the memory operation window is defined by the difference between the program level and the erase level. A large memory operation window is desired as good level separation between states is needed for cell operation. The performance of two-bit memory cells, however, is often degraded by the so-called "second bit effect" in which localized charges in the charge-trapping structure interact with each other. For example, during a reverse read operation, a read bias is applied to the drain terminal and the charge stored near the source region (i.e., a "first bit") is sensed, then the bit near the drain region (i.e., the "second bit"), however, creates a potential barrier for reading the first bit near the source region. This barrier may be overcome by applying a bias with a suitable magnitude, using the drain-induced barrier lowering (DIBL) effect to suppress the effect of the second bit near the drain region and allow the sensing of the storage status of the first bit. However, when the second bit near the drain region is programmed to a high Vt state and the first bit near the source region is at un-programmed state, the second bit raises this barrier substantially. Thus, as the Vt associated with the second bit increases, the read bias for the first bit becomes insufficient to overcome the potential barrier created thereby, and the Vt associated with the first bit is raised as a result of the higher Vt of the second bit reducing the memory operation window. The second bit effect decreases the memory operation window for 2-bit/cell operation, so there is a need for methods and devices capable of suppressing the second bit effect in memory devices.

On the other hand, a known non-volatile memory process includes the following steps. A blanket conductive layer is formed and then patterned into parallel linear conductive layers through a lithography process and a first etching process, bit lines are formed in the substrate between the linear conductive layers, and a dielectric layer is filled between the linear conductive layers. After word lines are formed, the linear conductive layers not covered by the word lines are removed by a second etching process so that the conductive layers remaining under the word lines serve as gates.

Figure 12:
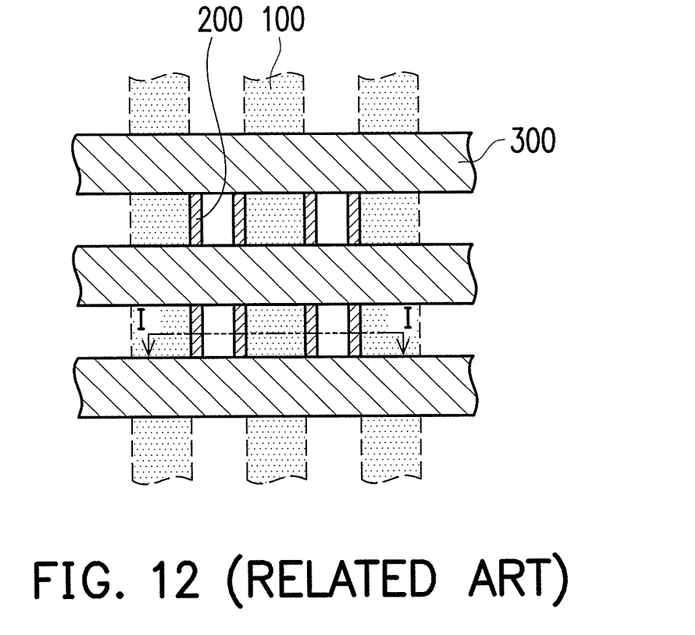
FIG. 12 illustrates, in a top view, formation of the short-causing stringers in etching the linear conductive layers in a prior-art semiconductor device process.
Figure 13:
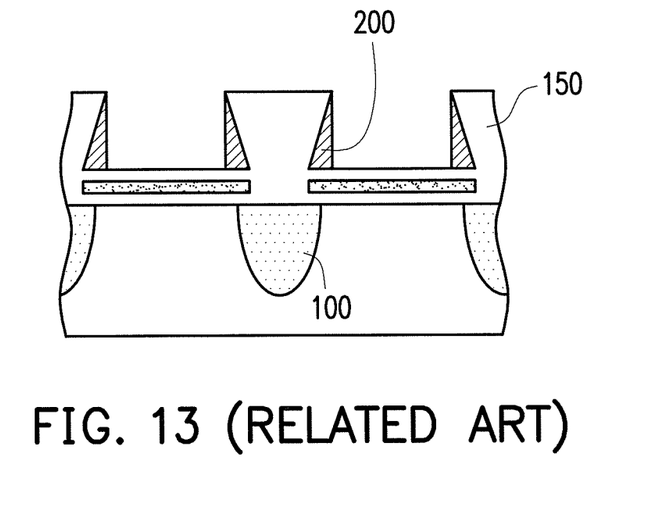
FIG. 13 illustrates the I-I cross-sectional view of the prior-art semiconductor device illustrated in FIG. 12.

However, as shown in FIG. 12 and FIG. 13 as the I-I cross-sectional view of the structure in FIG. 12, because the linear conductive layers usually have inclined sidewalls to facilitate the dielectric filling, the conductive material on the sidewalls of the dielectric layer 150 above the bit lines 100 is not easy to remove in the etching process of the linear conductive layer and forms stringers 200 thereat. Thus, the gates under neighboring word lines 300 are shorted with each other through the stringers 200. Hence, the stringer problem also has to be solved.

SUMMARY OF THE INVENTION

Accordingly, this invention provides a memory device that has well confined charge storage regions so that the charges stored are fully localized to reduce the $2^{nd}$-bit effect, minimize program disturbance behaviors and reduce the short channel effect.

This invention also provides a method for fabricating a memory device, which can prevent formation of stringers in etching the linear conductive layers and thereby prevents occurrence of a short circuit between neighboring gates.

A method for fabricating a memory device of this invention includes at least the following steps. A tunnel dielectric layer is formed over a substrate. A first portion of a conductive layer is formed over the tunnel dielectric layer. At least one charge storage layer is formed between the first portion of the conductive layer and the tunnel dielectric layer. Two doped regions are formed in the substrate beside the first portion of the conductive layer. A second portion of the conductive layer serving as a word line is formed on and electrically connected to the first portion of the conductive layer, wherein the second portion of the conductive layer having a thickness greater than a thickness of the first portion of the conductive layer. The ratio of the thickness of the second portion of the conductive layer to that of the first portion of the conductive layer ranges from 5:1 to 10:1.

In an embodiment of this invention, the thickness of the first portion of the conductive layer may range from 100 angstroms to 300 angstroms.

In an embodiment of this invention, the method further includes a gate dielectric is formed between the first portion of the conductive layer and the substrate, wherein two gaps are present at both sides of the gate dielectric and between the first portion of the conductive layer and the substrate, and the at least one charge storage layer is disposed in the gaps.

A method for fabricating a memory device of this invention includes at least the following steps. A gate dielectric is formed on a substrate and a conductive layer formed on the gate dielectric, wherein two recesses are formed at both sides of the gate dielectric and between the conductive layer and the substrate. A liner material layer is formed covering the surface of the substrate, the sidewalls of the gate dielectric, and the bottom, the sidewalls and the upper surface of the conductive layer, wherein the liner material layer does not fill up the recesses so that two gaps are foamed under the conductive layer. A charge storage material layer is formed on the surface of the liner material layer and in the gaps. A conversion process is performed to convert the charge storage material layer outside of the gaps into a spacer material layer, wherein the charge storage material layer in the gaps remains as a charge storage layer protrudent out of the sidewalls of the conductive layer. The spacer material layer and the liner material layer over the conductive layer and the substrate are removed to form a spacer layer and a liner layer on the sidewalls of the conductive layer.

In an embodiment of this invention, the conversion process includes a thermal oxidation process.

In an embodiment, removing the spacer material layer and liner material layer over the conductive layer and the substrate includes an anisotropic etching process.

In an embodiment, the method for fabricating the memory device further includes the following steps. A dielectric layer is formed surrounding the conductive layer. The surfaces of the dielectric layer and the conductive layer are substantially coplanar. A portion of the conductive layer and a portion of the dielectric layer are removed to reduce the thickness of the conductive layer. A word line is formed over the conductive layer. The conductive layer not covered by the word line is removed to form a gate under the word line.

In an embodiment of this invention, the ratio of the thickness of the word line to that of the gate ranges from 5:1 to 10:1.

In an embodiment of this invention, removing a portion of the conductive layer and a portion of the dielectric layer includes an etching process.

The method for fabricating a memory device of this invention can prevent formation of stringers in etching the linear conductive layers through a simple process, thus preventing occurrence of short circuit. Moreover, since the charge storage layers are separated from each other, the memory device of this invention has two well confined charge storage regions so that the charges stored are fully localized to reduce the second-bit effect, minimize the program disturbance behaviors and reduce the short channel effect. Such structure of the charge storage layers can be made by a simple process in the fabricating method of this invention.

In order to make the aforementioned and other features and advantages of the invention more comprehensible, several embodiments accompanied with figures are described in detail below.

DESCRIPTION OF EMBODIMENTS

The following embodiment is intended to further explain this invention, but is not intended to restrict the scope of this invention.

Figure 6:
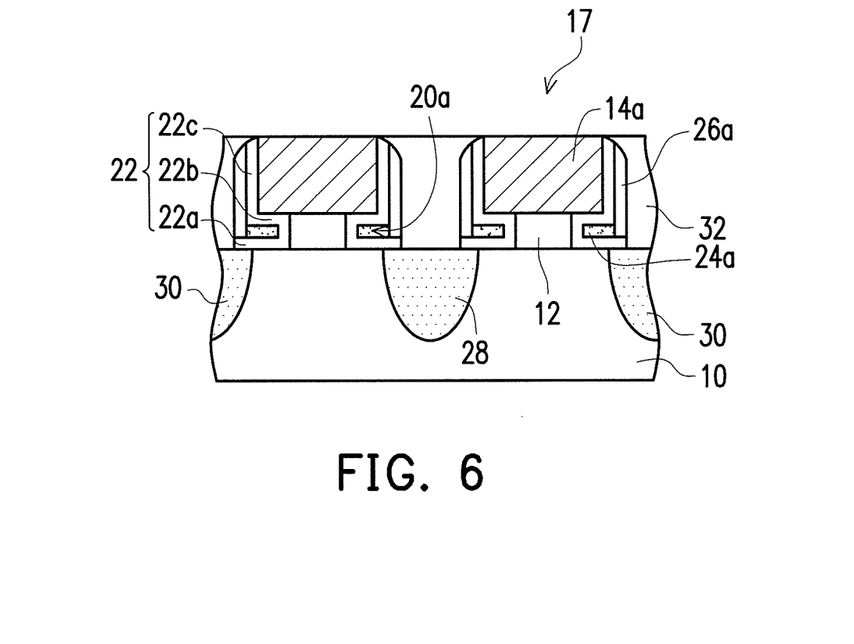
Figure 7:
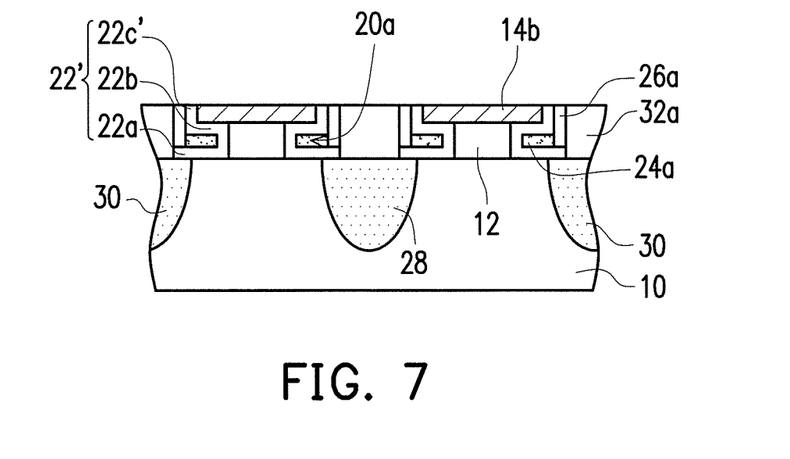
Figure 8:
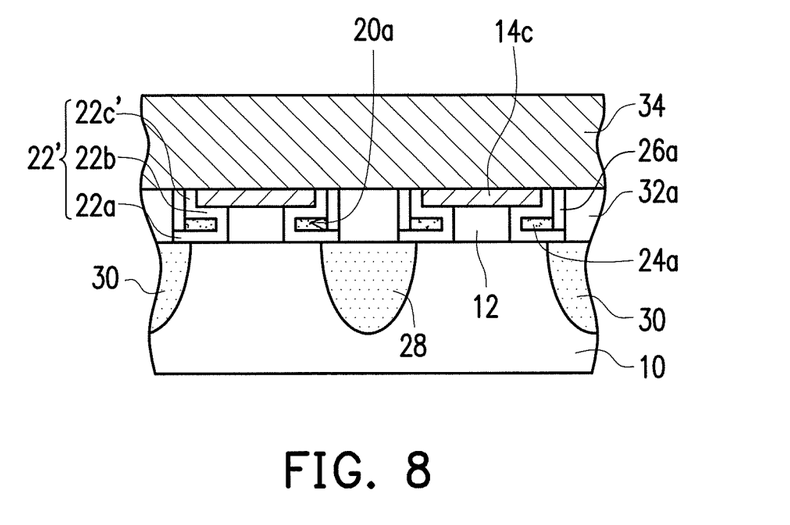
Figure 9:
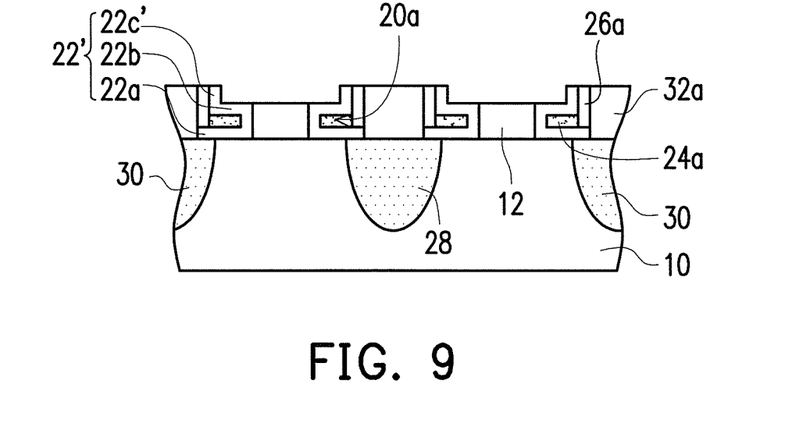
FIG. 9 illustrates another cross-sectional view of the memory device fabricated by the process illustrated in FIGS. 1-8.
Figure 10:
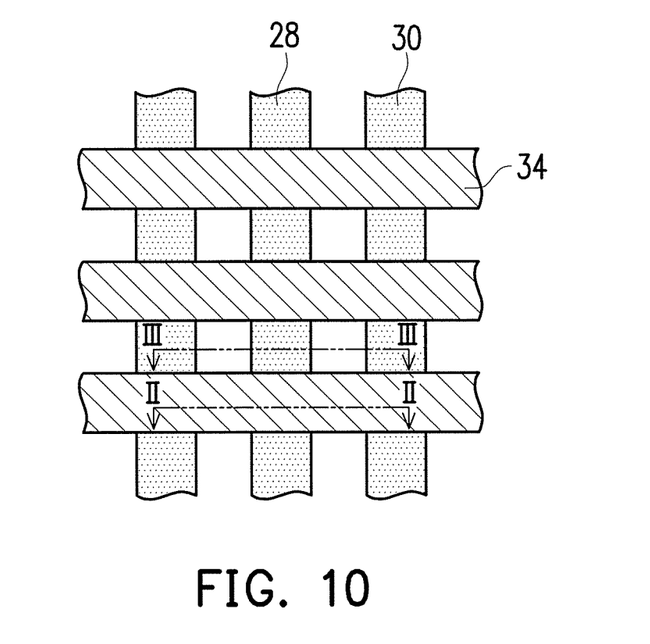
FIG. 10 illustrates a top view of the memory device illustrated in FIG. 8/9, wherein the cross-sectional view corresponds to FIG. 8/9.

FIGS. 1-8 illustrate, in a cross-sectional view, a method for fabricating a memory device according to an embodiment of this invention, FIG. 9 illustrates another cross-sectional view of the memory device, and FIG. 10 illustrates a top view of the same, wherein the II-II/III-III cross-sectional view corresponds to FIG. 8/9.

Figure 1:
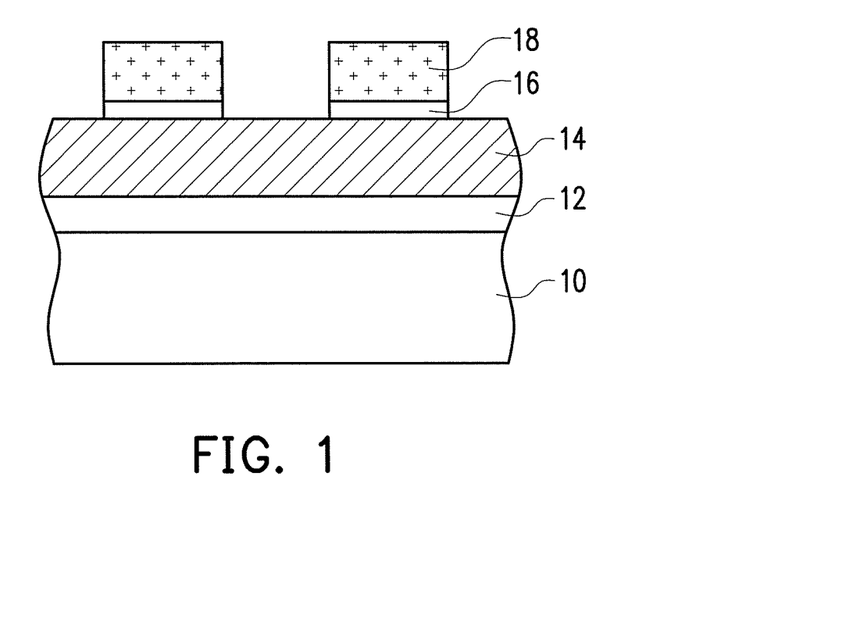
FIGS. 1-8 illustrate, in a cross-sectional view, a method for fabricating a memory device according to an embodiment of this invention.

Referring to FIG. 1, a gate dielectric 12 is formed on a substrate 10, and then a blanket conductive layer 14 is formed on the gate dielectric 12. The substrate 10 may include a semiconductor material, such as bulk silicon or silicon on insulator (SOI), or a semiconductor compound. The gate dielectric 12 may include silicon oxide or other suitable material, and may be formed by the thermal oxidation, CVD or other suitable method. The conductive layer 14 may include doped poly-Si, and may be formed by depositing undoped poly-Si through CVD and ion-implanting the same, or by poly-Si CVD with in-situ doping.

Then, a patterned hard mask layer 16 and a patterned mask layer 18 are formed on the conductive layer 14. The hard mask layer 16 may include an advanced patterning film (APF), and may be fanned by CVD. The patterned mask layer 18 may include a photoresist material. The patterns of the mask layer 18 can be formed through exposure and development, and the patterns of the hard mask layer 16 can be transferred from the mask layer 18.

Figure 2:
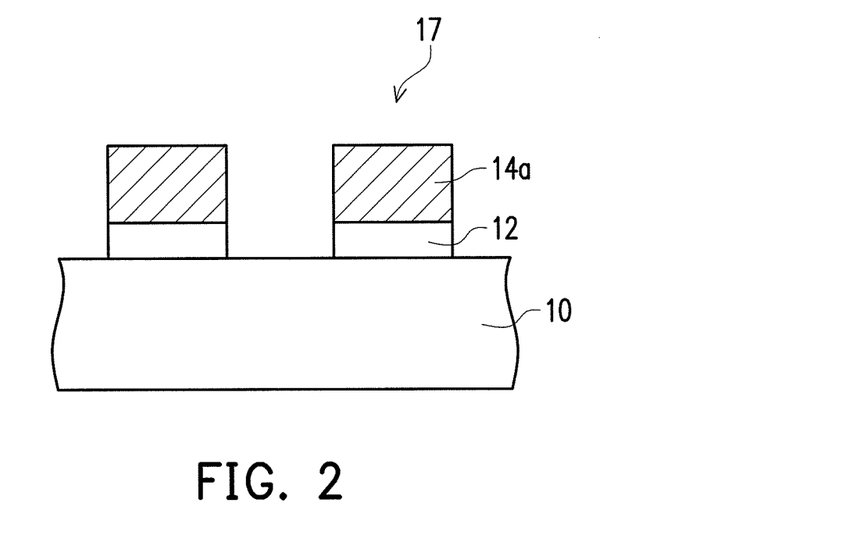

Referring to FIG. 2, an etching process is performed, with the patterned mask layer 18 and hard mask layer 16 as a mask and the substrate 10 as an etching end, to pattern the conductive layer 14 into a plurality of separate conductive layers 14a and successively pattern the gate dielectric 12, so that MOS structures 17 are formed. The etching process may be an anisotropic etching process. The anisotropic etching process may be a plasma etching process. Thereafter, the patterned mask layer 18 and the patterned hard mask layer 16 are removed. In this embodiment, each conductive layer 14a has a linear shape in the top view, of which the extension direction is substantially parallel with that of the doped regions 28 and 30 formed later.

Figure 3:
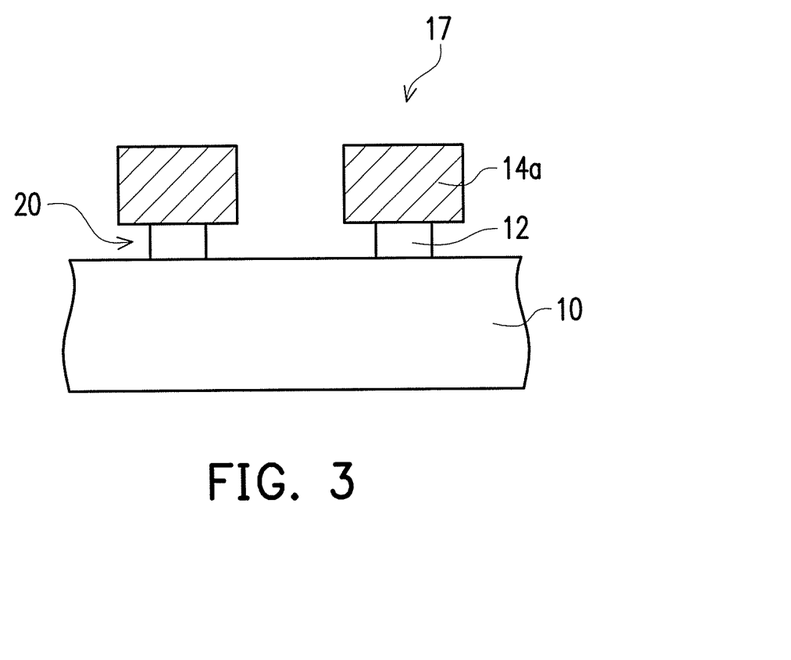

Referring to FIG. 3, an isotropic etching process is performed to remove a portion of the gate dielectric 12 and produce an undercut under the conductive layer 14a, so that two recesses 20 are formed at both sides of the gate dielectric 12 under the gate 14a as local storage spaces.

Figure 4:
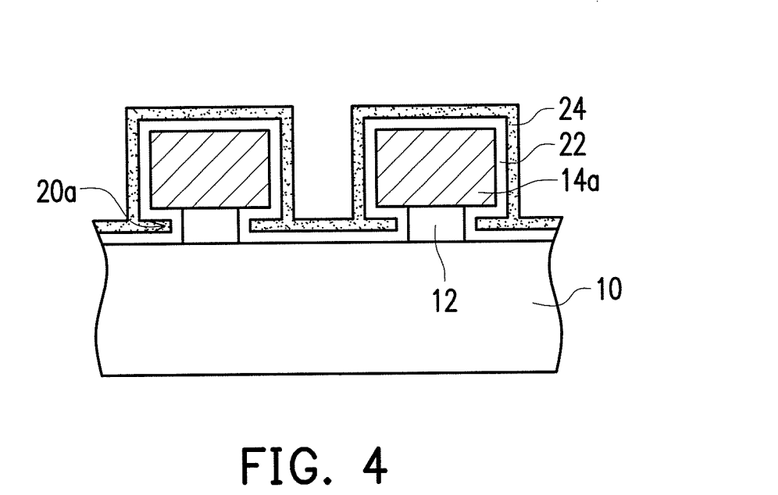

Referring to FIG. 4, a liner material layer 22 is formed covering the top surface, the sidewalls and the exposed bottoms of each conductive layer 14a, the sidewalls of the gate dielectric 12, and the exposed surfaces of the substrate 10. In an embodiment, the liner material layer 22 conformally covers the top surface, the sidewalls and the exposed bottoms of each conductive layer 14a, the sidewalls of the gate dielectric 12, and the exposed surfaces of the substrate 10. The liner material layer 22 fills in the recesses 20 (FIG. 3) but does not fill up the same, so that two gaps 20a remain in the recesses 20. The liner material layer 22 may include silicon oxide, may be formed through thermal oxidation, ISSG (in-situ steam generation) oxidation, CVD, atomic layer deposition (ALD) or furnace oxidation.

Then, a charge storage material layer 24 is formed, covering the liner material layer 22 on the top surfaces and the sidewalls of each conductive layer 14a and on the substrate 10, and filling up the gaps 20a. The charge storage material layer 24 may include silicon nitride (SiN) or doped poly-Si. SiN may be formed through furnace deposition, LPCVD or ALD. Doped poly-Si may be formed by poly-Si CVD with in-situ doping.

Figure 5:
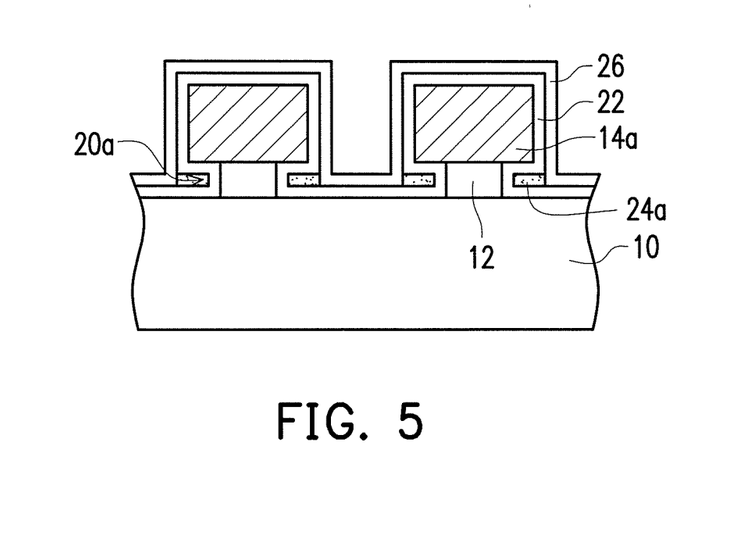

Referring to FIG. 5, a conversion process is performed to convert the charge storage material layer 24 outside of the gaps 20a into a spacer material layer 26, such that the charge storage material layer 24 in the gaps 20 remains to serve as a charge storage layers 24a. The conversion process can be arbitrary process capable of making the material of the spacer material layer 26 different from that of the charge storage material layer 24. In an embodiment, the charge storage material layer 24 includes SiN, the spacer material layer 26 includes silicon oxide, and the conversion process may be a thermal oxidation process.

Referring to FIG. 6, the spacer material layer 26 and the liner material layer 22 are anisotropically etched to form spacer layers 26a, exposing the top surface of each conductive layer 14a and surfaces of the substrate 10. The charge storage layers 24a disposed in the gaps 20a protrude out of the sidewalls of the conductive layer 14a.

The remaining liner material layer 22 includes three portions 22a, 22b and 22c. The first portion 22a of the liner material layer 22 is between the substrate 10 and the charge storage layer 24a, serving as a tunnel dielectric layer. The second portion 22b is under the conductive layer 14a and between the conductive layer 14a and the charge storage layer 24a, serving as a top dielectric layer. The third portion 22c is on the sidewall of the conductive layer 14a, and is between the conductive layer 14a and the spacer layer 26a to serve as a liner layer. Each spacer layer 26a is on the sidewalls of the corresponding conductive layer 14a, liner layer 22c and charge storage layer 24a.

An ion-implantation process is then performed to form doped regions 28 and 30 in the substrate 10 beside the conductive layer 14a. The dopant implanted in the dope region 28 and the dopant implanted in the doped region 30 have the same conductivity type, being different from the conductivity type of the substrate 10. In an embodiment, the substrate 10 is P-doped and the doped regions 28 and 30 are N-doped. In another embodiment, the substrate 10 is N-doped and the doped regions 28 and 30 are P-doped. The N-type dopant may be phosphorus or arsenic. The P-type dopant may be boron or boron difluoride. The doped regions 28 and 30 can serve as a source region and a drain region of a memory cell. The doped regions 28 and 30 are disposed in the substrate 10 beside the conductive layer 14a, wherein each charge storage layer 24a has a portion located above the corresponding doped region 28 or 30.

Thereafter, a dielectric layer 32 is formed over the substrate 10, filling up the gaps between the conductive layers 14a to form a planar surface, and exposing the top surfaces of the conductive layers 14a. The dielectric layer 32 may include silicon oxide, and may be formed by depositing a dielectric material layer through CVD and then planarizing the same. The planarization may utilize etching-back or CMP.

Referring to FIG. 7, a thinning process is performed to remove a portion of each conductive layer 14a, a portion of the dielectric layer 32, a portion of each liner layer 22c and a portion of each spacer layer 26a to form much thinner conductive layers 14b, a thinner dielectric layer 32a, shorter liner layers 22c' and shorter spacer layers 26a. The planarization of this step may include an anisotropic etching process with a low etching selectivity ratio between the conductive layers 14a and the dielectric layer 32. In addition, the thickness of the conductive layer 14b after the thinning process may be 300 angstroms or less, possibly from 100 angstroms to 300 angstroms.

Referring to FIG. 8 and FIG. 9 illustrating another cross-sectional view of the memory device to be formed, a word line 34 is formed on the thin dielectric layer 32a and on the thin conductive layers 14b. In an embodiment, the extension direction of the word line 34 is different from that of the doped regions 28 and 30, and may be substantially perpendicular to the latter. The word line 34 may be formed by depositing a blanket conductive material layer and then patterning the same through lithography and etching. The word line 34 includes a conductive material, which may be doped poly-Si, metal, metal alloy, or a combination thereof. Doped poly-Si may be formed by poly-Si CVD with in-situ doping. The metal or metal alloy may be formed by sputtering or CVD, or other suitable method.

After the word lines 34 are formed by etching, the thin conductive layers 14b not covered by the word lines 34 are successively removed in the same or different etching chamber, so that the thin conductive layers 14b are patterned into a plurality of gates 14c under the word lines 34, as shown in FIG. 8 and FIG. 10 that illustrates a top view of the memory device illustrated in FIG. 8/9, wherein the II-II/III-III cross-sectional view corresponds to FIG. 8/9. The word lines 34 are electrically connected to the gates 14c, and between the word lines 34 the thin dielectric layer 32a, the gate dielectric 12 and the liner material layer 22' are exposed, as shown in FIGS. 9-10. Because the thickness of the thin conductive layers 14b is quite small, the conductive layers 14b not covered by the word lines 34 can be entirely removed easily so that there is no residue of the conductive layers 14b thereat and a short circuit is prevented. The thickness of the word lines 34 is larger than that of the gates 14c. In an embodiment, the ratio of the thickness of the word lines 34 to that of the gates 14c may range from 5:1 to 10:1.

Referring to FIGS. 8-10 again, the memory device according to this embodiment of this invention includes a gate 14c, a gate dielectric 12, a liner material layer 22', two charge storage layers 24a, two doped regions 28 and 30, and a word line 34.

The gate 14c is disposed on the substrate 10. The gate dielectric 12 is between the gate 14c and the substrate 10. The width of the gate dielectric 12 is smaller than that of the gate 14c in a symmetric manner, so that two gaps 20a are present at both sides of the gate dielectric 12 and between the gate 14c and the substrate 10.

The material of the two charge storage layers 24a is different from that of the gate dielectric 12. Each charge storage layer 24a protrudes out of the corresponding sidewall of the gate 14c.

The liner material layer 22' includes a tunnel dielectric layer 22a, a top dielectric layer 22b and a liner layer 22c'. The tunnel dielectric layer 22a is disposed between the charge storage layer 24a and the substrate 10. The top dielectric layer 22b is disposed under the gate 14c and is between the gate 14c and the charge storage layer 24a. The liner layer 22c' is disposed on a sidewall of the gate 14c and between the gate 14c and the spacer layer 26a. The spacer layer 26a is disposed on the sidewalls of the liner layer 22c' and the charge storage layer 24a. In an embodiment, the material of the tunnel dielectric layers 22a, the top dielectric layers 22b, the liner layers 22c' and the spacer layers 26a is different from that of the charge storage layers 24a.

The doped regions 28 and 30 are located in the substrate 10 at both sides of the gate 14c, each having a portion extending to below the neighboring charge storage layers 24a. The dopant implanted in the dope region 28 and that implanted in the doped region 30 have the same conductivity type, being different from the conductivity type of the substrate 10.

The word line 34 is electrically connected to the gate 14c. The thickness of the word line 34 is larger than that of the gate 14c. In an embodiment, the ratio of the thickness of the word line 34 to that of the gate 14c may range from 5:1 to 10:1.

Although there are two separated charge storage regions under each gate in the above embodiment, this invention is not limited to such case. The concept of partially removing the conductive layers as the precursor of the gates to reduce the thickness of the gates formed later can also be applied to, for example, a case where only one storage region is under each gate, as shown in FIG. 11.

Figure 11:
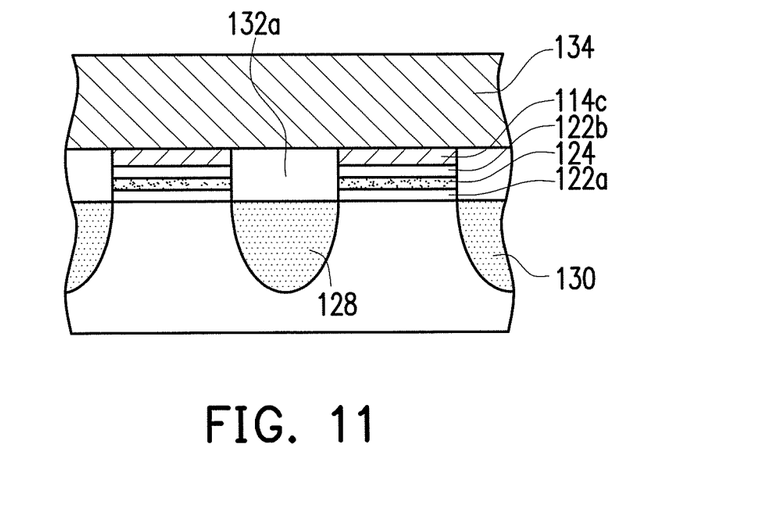
FIG. 11 illustrates, in a cross-sectional view, a memory device having only one storage region under its gate according to another embodiment of this invention.

Referring to FIG. 11, the memory device according to another embodiment of this invention includes a gate 114c, a tunnel dielectric layer 122a, a top dielectric layer 122b, a charge storage layer 124 with only one charge storage region, doped regions 128 and 130, and a word line 134. The materials of the gate 114c, the tunnel dielectric layer 122a, the top dielectric layer 122b, the charge storage layer 124, the doped regions 128 and 130 and the word line 134 may be similar to those of the gate 14c, the tunnel dielectric layer 22a, the top dielectric layer 22b, the charge storage layer 24a, the doped regions 28 and 30 and the word line 34 in the precedent embodiment of this invention.

The memory device shown in FIG. 11 may be fabricated by the following steps. A MOS structure is formed, including the tunnel dielectric layer 122a, the charge storage layer 124, the top dielectric layer 122b, and a conductive layer for forming the gate 114c. After the MOS structure is patterned into linear structures by anisotropic etching, ion implantation is done to form the doped regions 128 and 130 in the substrate 110. After the dielectric layer 132a is formed as above, a thinning process is performed as above, and then the word line 134 is formed. The thinned linear conductive layer not covered by the word line 134 is removed, wherein the remaining linear conductive layer under the word line 134 serves as the gate 114c.

Since the two charge storage layers are separated from each other, the memory device of this invention has two well confined charge storage regions so that the charges stored are fully localized to reduce the $2^{nd}$-bit effect, minimize the program disturbance behaviors and reduce the short channel effect. Moreover, by reducing the thickness of the linear conductive layers as the precursor of the gates, the method for fabricating a memory device of this invention can prevent formation of stringers in etching the linear conductive layers, thereby effectively preventing a short circuit.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating a memory device, comprising:
forming a tunnel dielectric layer over a substrate;
forming a first portion of a conductive layer over the tunnel dielectric layer;
forming at least one charge storage layer between the first portion of the conductive layer and the tunnel dielectric layer;
forming two doped regions in the substrate beside the first portion of the conductive layer; and
forming a second portion of the conductive layer serving as a word line on and electrically connected to the first portion of the conductive layer, wherein the second portion of the conductive layer covers across the two doped regions and connects to a second portion of a conductive layer of another memory device, and the second portion of the conductive layer having a thickness greater than a thickness of the first portion of the conductive layer, wherein a ratio of the thickness of the second portion of the conductive layer to the thickness of the first portion of the conductive layer ranges from 5:1 to 10:1.

2. The method of claim 1, wherein the thickness of the first portion of the conductive layer ranges from 100 angstroms to 300 angstroms.

3. The method of claim 1, further comprising forming a gate dielectric between the first portion of the conductive layer and the substrate, wherein two gaps are present at both sides of the gate dielectric and between the first portion of the conductive layer and the substrate, and the at least one charge storage layer is disposed in the gaps.

4. The method of claim 3, further comprising forming a liner material layer covering a surface of the substrate, sidewalls of the gate dielectric, and a bottom and sidewalls of the first portion of the conductive layer, wherein the second portion of the conductive layer further covers upper surface of the liner material layer.

5. The method of claim 1, further comprising forming a dielectric layer on the two doped regions, wherein the second portion of the conductive layer further covers upper surface of the dielectric layer.

6. The method of claim 1, wherein the second portion of the conductive layer further extends to cover another first portion of another conductive layer of another memory device.

7. The method of claim 5, wherein the dielectric layer is in contact with the two doped regions.

8. A method for fabricating a memory device, comprising:
   forming a gate dielectric on a substrate and a conductive layer on the gate dielectric, wherein two recesses are formed at both sides of the gate dielectric and between the conductive layer and the substrate;
   forming a liner material layer covering a surface of the substrate, sidewalls of the gate dielectric, and a bottom, sidewalls and an upper surface of the conductive layer, wherein the liner material layer does not fill up the recesses so that two gaps are formed under the conductive layer;
   forming a charge storage material layer on a surface of the liner material layer and in the gaps;
   performing a conversion process to convert the charge storage material layer on the surface of the liner material layer covering the surface of the substrate, the sidewalls and the upper surface of the conductive layer into a spacer material layer, wherein the charge storage material layer in the gaps remains as a charge storage layer protruding out of the sidewalls of the conductive layer, wherein the conversion process comprises a thermal oxidation process; and
   removing the spacer material layer and the liner material layer above the conductive layer and the substrate to form a spacer layer and a liner layer on the sidewalls of the conductive layer.

9. The method of claim 8, wherein removing the spacer material layer and the liner material layer over the conductive layer and the substrate comprises an anisotropic etching process.

10. The method of claim 8, wherein the liner material layer conformally covers the surface of the substrate, the sidewalls of the gate dielectric, and the bottom, sidewalls and the upper surface of the conductive layer.

11. A method for fabricating a memory device, comprising:
   forming a gate dielectric on a substrate and a conductive layer on the gate dielectric, wherein two recesses are formed at both sides of the gate dielectric and between the conductive layer and the substrate;
   forming a liner material layer covering a surface of the substrate, sidewalls of the gate dielectric, and a bottom, sidewalls and an upper surface of the conductive layer, wherein the liner material layer does not fill up the recesses so that two gaps are formed under the conductive layer;
   forming a charge storage material layer on a surface of the liner material layer and in the gaps;
   performing a conversion process to convert the charge storage material layer on the surface of the liner material layer covering the surface of the substrate, the sidewalls and the upper surface of the conductive layer into a spacer material layer, wherein the charge storage material layer in the gaps remains as a charge storage layer protruding out of the sidewalls of the conductive layer;
   removing the spacer material layer and the liner material layer above the conductive layer and the substrate to form a spacer layer and a liner layer on the sidewalls of the conductive layer;
   forming a dielectric layer surrounding the conductive layer, wherein surfaces of the dielectric layer and the conductive layer are substantially coplanar;
   removing a portion of the conductive layer and a portion of the dielectric layer to reduce a thickness of the conductive layer;
   forming a word line over the conductive layer and the dielectric layer; and
   removing the conductive layer not covered by the word line to form a gate under the word line.

12. The method of claim 11, wherein a ratio of the thickness of the word line to the thickness of the gate ranges from 5:1 to 10:1.

13. The method of claim 11, wherein removing a portion of the conductive layer and a portion of the dielectric layer comprises an etching process.

14. The method of claim 11, further comprising:
   forming two doped regions in the substrate beside the conductive layer before the step of forming the dielectric layer is performed.

15. The method of claim 14, wherein the dielectric layer is in contact with the two doped regions.

* * * * *